United States Patent [19]

Crivello et al.

[11] Patent Number: 5,310,619
[45] Date of Patent: May 10, 1994

[54] RESIST COMPOSITIONS COMPRISING A PHENOLIC RESIN, AN ACID FORMING ONIUM SALT AND A TERT-BUTYL ESTER OR TERT-BUTYL CARBONATE WHICH IS ACID-CLEAVABLE

[75] Inventors: James V. Crivello, Clifton Park; Michael J. O'Brien, Albany; Julia L. Lee, Schenectady, all of N.Y.

[73] Assignee: MicroSi, Inc., Phoenix, Ariz.

[21] Appl. No.: 889,261

[22] Filed: May 13, 1992

Related U.S. Application Data

[63] Continuation of Ser. No. 629,054, Dec. 14, 1990, abandoned, which is a continuation of Ser. No. 338,346, Apr. 12, 1989, abandoned, which is a continuation of Ser. No. 135,963, Dec. 21, 1987, abandoned, which is a continuation-in-part of Ser. No. 873,914, Jun. 13, 1986, abandoned.

[51] Int. Cl.$^5$ .................. G03F 7/004; G03F 7/40
[52] U.S. Cl. ...................... 430/270; 430/326; 430/330; 430/905; 430/907; 430/914; 430/921
[58] Field of Search ............. 430/270, 157, 176, 281, 430/905, 907, 914, 921, 326, 330

[56] References Cited

U.S. PATENT DOCUMENTS

| | | | |
|---|---|---|---|
| 3,779,778 | 12/1973 | Smith et al. | 430/270 |
| 4,058,400 | 11/1977 | Crivello | 96/86 |
| 4,058,401 | 11/1977 | Crivello | 96/115 |
| 4,069,055 | 1/1978 | Crivello | 96/115 |
| 4,151,175 | 4/1979 | Crivello | 260/326.26 |
| 4,491,628 | 1/1985 | Ito et al. | 430/270 |
| 4,603,101 | 7/1986 | Crivello | 430/270 |
| 4,663,269 | 5/1987 | Narang et al. | 430/270 |
| 4,666,820 | 5/1987 | Chandross et al. | 430/270 |
| 4,678,737 | 7/1987 | Schneller et al. | 430/270 |
| 4,708,925 | 11/1987 | Newman | 430/270 |

FOREIGN PATENT DOCUMENTS

| | | |
|---|---|---|
| 0146411 | 6/1985 | European Pat. Off. |
| 1317796 | 5/1973 | United Kingdom. |
| 1319050 | 5/1973 | United Kingdom. |

OTHER PUBLICATIONS

Pappas, *Photogeneration of Acid: Part 6–A Review of Basic Principles for Resist Imaging Applications,* 11(4), J. Im. Tech., 146–57, (Aug. 1985).

Thompson, Willson, and Bowden, *Introduction to Microlithography,* 219, Am. Chem. Soc'y Symposium, 111, 114–15 (1983).

Pacansky and Lyeria, *Photochemical Decomposition Mechanisms for AZ-type Photoresists,* 23(1), I.B.M. J. Res. Develop., 42–55, (Jan. 1979).

March, *Advanced Organic Chemistry Reactions, Mechanisms, and Structure,* 344–47 (1977).

H. J. Timpe, et al., *Light Induced Polymer and Polymerization Reactions 9–Initiation of Photo-polymerization by the Initiator Systems Trisoxalatoferrate/Arene Onium Salts,* 4(3), Poly. Photochem., 223–240 (1984).

Grunwald, et al., *Negative-Acting Aqueous Base-Developable Photoresist with Submicron Resolution Capabilities over Topography,* 771, Advances in Resist Technology and Processing (IV), 317, 321 (1987).

Greene, *Protective Groups in Organic Synthesis,* 21–25 and 94 (1981).

*Primary Examiner*—Charles L. Bowers, Jr.
*Assistant Examiner*—John S. Chu
*Attorney, Agent, or Firm*—Davis Hoxie Faithfull & Hapgood

[57] ABSTRACT

A positive photoresist composition is provided which can be used in the presence or absence of atmospheric moisture. There is used a major amount of a commercially available resin, such as a novolak, a dissolution inhibitor with thermally labile t-butyl ether or ester groups, and an aryl onium salt.

12 Claims, No Drawings

RESIST COMPOSITIONS COMPRISING A PHENOLIC RESIN, AN ACID FORMING ONIUM SALT AND A TERT-BUTYL ESTER OR TERT-BUTYL CARBONATE WHICH IS ACID-CLEAVABLE

This is a continuation of copending application(s) Ser. No. 07/629,054 filed on Dec. 14, 1990, now abandoned, which is a continuation of copending application Ser. No. 07/338,346 filed on Apr. 12, 1989, now abandoned, which is a continuation of copending application Ser. No. 07/135,963 filed Dec. 21, 1987, now abandoned, is a continuation-in-part of copending application Ser. No. 873,914, filed Jun. 13, 1986, abandoned, assigned to the same assignee as the present invention and incorporated herein by reference.

BACKGROUND OF THE INVENTION

Prior to the present invention, positive photoresists were generally based on moisture dependent chemistry utilizing a base polymer such as a novolak resin and a substituted 1,2-diazonapthoquinone as a dissolution inhibitor to render the novolak resin insoluble to development by dilute aqueous base, as shown by L. F. Thompson et al., *Introduction to Microlithography*, A.C.S. Symposium Series 219, American Chemical Society (1983) page 111. Upon irradiation, under moisture containing ambient conditions, the diazonaphthoquinone undergoes rearrangement and those portions of the resist which have received irradiation by image-wise exposure are rendered soluble to dilute aqueous base. While these photoresists are widely used, they are generally limited to the near UV above 366 nm based on the absorption characteristics of the diazonaphthoquinone. Although the quantum yield of the diazonaphthoquinone system is limited to a maximum value of 1.0, that is no more than one molecule of photosensitive composition can react per quanta of actinic light absorbed, its actual effective quantum yield has a value of only about 0.3.

Another moisture-dependent system utilizing ketals or acetals as the dissolution inhibitor in combination with a novolak resin is shown by Smith et al., U.S. Pat. No. 3,779,778. Smith et al., employs a photolyzable acid progenitor such as a chlorine substituted triazene, which, upon exposure to actinic irradiation, generates an acidic material which can catalyze the hydrolysis of the dissolution inhibitor.

Even though moisture-dependent positive photoresists systems are used extensively in the manufacture of high density electronic circuits, the successful implementation of such microlithographic processing requires a constant monitoring of the ambient atmospheric moisture to maintain a sufficient concentration of the water vapor needed to allow chemistry inherent in the reactions to proceed satisfactorily. For example, as shown by J. Pacansky et al., *Photochemical Decomposition Mechanisms for AZ-type Photoresists*, I.B.M., J. Res. Develop. 23, No. 1 (January 1979) pages 42–54, and particularly page 50, the importance of water is illustrated in the proper functioning of the orthonaphthoquinone diazide. In instances where the naphthoquinonediazide is photolyzed in the absence of water, the intermediate ketene reacts rapidly with the novolak resin to form a carboxylic acid ester which can lead to negative tone images. However, irradiation in the presence of ambient water results in the production of a 3-indene carboxylic acid which can be solubilized as the salt in the basic developer. As discussed by J. March in Advanced Organic Chemistry, *Reaction Mechanisms and Structures*, McGraw Hill Book Co., New York, Second Edition (1977) pages 345, acetals, ketals and orthoesters are readily cleaved by dilute aqueous acids.

As a result of moisture dependency, severe photolithographic problems can arise in particular situations, if moisture dependent positive photoresists are used under moisture free conditions. It has been found, for example, that if a moisture dependent positive photoresist is used with a Model 1100 wafer-stepper of the Ultratek Company of Santa Clara, Calif., or the Model 946SOR wafer-stepper of the Aste Company of Woodlawn Hills, Calif., a serious problems can arise in the fabrication of high density electronic circuits. The afore-mentioned instruments require a constant stream of a dry inert gas, between the lens and the surface of the photoresist in order to properly gauge the distance between the lens and the photoresist surface. As a result, it has been found that the speed of a moisture dependent photoresist can be impaired or rendered inoperable depending upon the period of time the wafer-stepper is used.

Recently, as shown by Ito et al., U.S. Pat. No. 4,491,628, Crivello, U.S. Pat. 4,603,101, and Narana et al., U.S. Pat. No. 4,663,269, incorporated herein by reference, chemically amplified positive photoresists systems utilizing acid generating onium salts have been developed, using t-butylester or t-butylether substituted materials which do not require the presence of moisture to function. As is well-known to those skilled in the art, such acid catalyzed cleavage of t-butylesters or t-butylethers result in an elimination reaction and the production of isobutylene and the corresponding acid or phenol. Accordingly, positive photoresists, such as Crivello, Ito et al., or Narano et al., can be readily employed either under substantially anhydrous conditions, if desired, or, optionally, under atmospheric or ambient conditions in a conventional manner. These t-butylester or t-butylether substituted polymers can be used in combination with an arylonium salt which generate a strong acid upon irradiation. These positive photoresists, having acid labile t-butylester or t-butylether groups, must be heated to deblock the acid labile groups. The deblocked portions of the polymer are rendered soluble in aqueous base, or insoluble in an organic solvent.

Even though the positive photoresists of Crivello, Ito et al., or Narana et al. can be utilized in the substantial absence, or optionally in the presence of moisture, these thermally deblocked photoresist systems require the use of special polymers. These special polymers having pendant t-butylester or t-butylether groups, or such groups along the polymer backbone, are at present not commercially available and therefore economically unattractive.

An object of the present invention, therefore, is to provide a positive photoresist system which can be used either in the substantial absence, or in the presence of moisture.

A further object of the present invention is to provide a positive photoresist system which incorporates at least a major amount by weight of a commercially available organic resin.

An additional object of the present invention is to provide a positive photoresist system which uses an effective amount of an arylonium salt which photo decomposes to a Brönsted acid.

The present invention is based on the discovery that commercially available novolak resins can be heated under particular conditions in the presence of a strong acid, such as an acid having a pKa of less than 0, without a significant degree of cross-linking occurring in the novolak. This result is quite surprising since, as taught by David Gould, *Phenolic Resins*, Reinhold Publishing Company, New York (1959) page 32, novolaks are unstable at elevated temperatures in the presence of a strong acid. This is confirmed by Newman, U.S. Pat. No. 4,708,925, which shows that crosslinking of a novolak can occur if heated in the presence of a Brönsted acid generated by an irradiated arylonium salt. A negative, instead of positive, image can be formed. Negative-tone images in novolak resin systems resulting from acid-catalyzed thermally activated reaction are also discussed in SPIE, Vol. 771, "Advances in Resist Technology and Processing", IV (1987) p.321.

Unexpectedly, we have discovered that a novolak resin can be heated in the presence of a strong acid as previously defined without a significant degree of cross-linking occurring in the novolak, if it is heated in the presence of a simple compound, as defined hereinafter, having a molecular weight of less than 1000 and thermally labile t-butylester or t-butylether groups. Simple compound deblocking occurs in the presence or absence of moisture. Upon deblocking, the simple compound and the novolak resin become soluble in aqueous base. The novolak resin does not cross-link to a significant degree, even though it is heated in the presence of a strong acid during deblocking. Accordingly, there is provided by the present invention, a positive photoresist which can be photopatterned in the presence or absence of water. The positive photoresist comprises a combination of a water or aqueous base insoluble simple compound having acid labile groups, such as t-butylester or t-butylether groups, a major amount by weight of an aqueous base soluble organic polymer, such as a commercially available novolak resin, and an arylonium salt.

STATEMENT OF THE INVENTION

A positive photoresist photopatternable in the presence or in the substantial absence of moisture comprising, (A) a water or aqueous base soluble phenolic resin,
(B) from at least about 10% to up to an equal proportion by weight of (A), of a water or aqueous base insoluble simple compound having a MW of less than 1000 which is a dissolution inhibitor for (A), and
(C) an effective amount of an aryl onium salt which generates a strong acid having a pKa value of less than 0 upon being irradiated, where (B) is substituted with acid labile groups which can be deblocked by being heated in the presence of a strong acid, thereupon rendering both (A) and (B) soluble in water or aqueous base.

Some of the water or aqueous base soluble phenolic resins which can be utilized in the practice of the present invention to make the above described resist compositions, are, for example: phenol novolak resins, cresol novolak resins, chlorophenol novolak resins, 4-hydroxyphenylmaleimide copolymerized with a member selected from styrene, stilbene, vinyl ethers, and 4-hydroxy styrene, and polymers such as poly-4-vinylphenol, and poly-4-hydroxy-α-methylstyrene.

Among the acid labile group substituted simple compounds, or dissolution inhibitors referred to hereinafter as "inhibitor" which can be utilized in the practice of the present invention to make the water or aqueous base soluble resists are, for example:

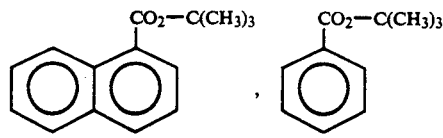

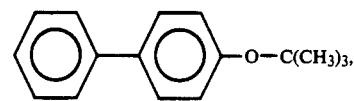

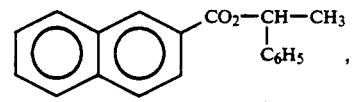

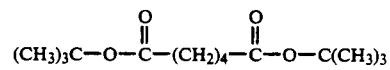

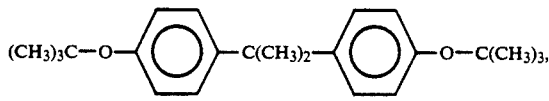

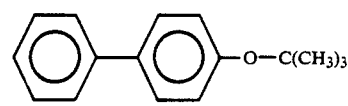

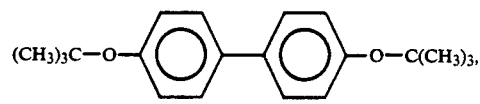

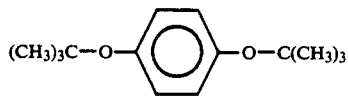

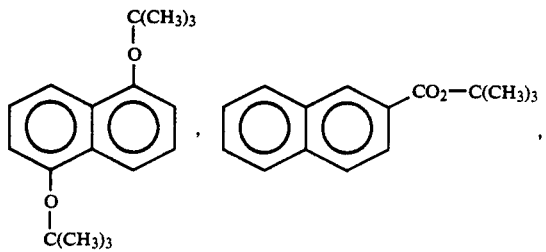

-continued

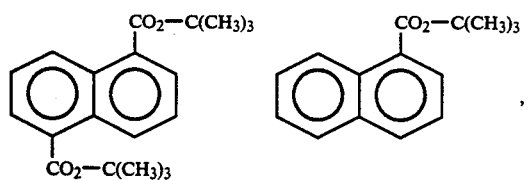

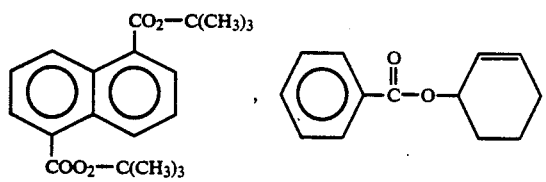

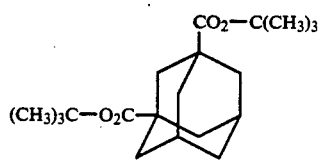

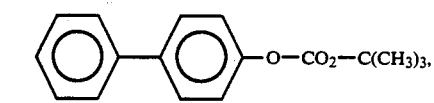

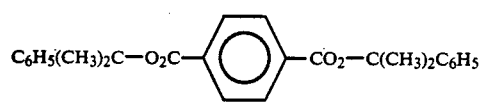

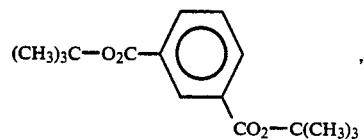

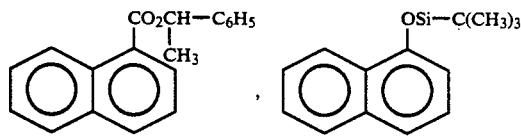

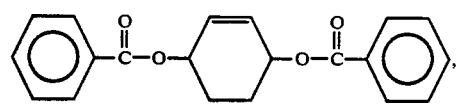

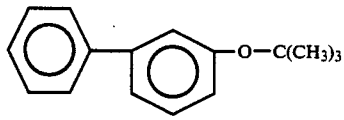

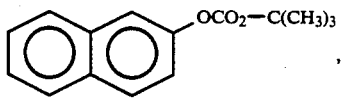

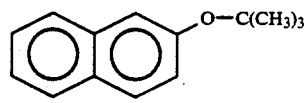

-continued

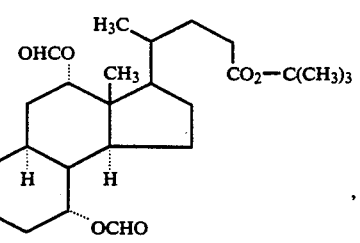

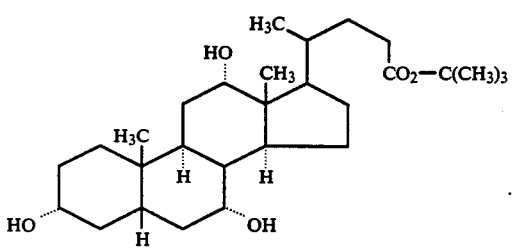

Preferably, the inhibitors of the present invention have a molecular weight of less than about 1000. They have acid labile pendant groups which are preferably tert-butyl esters of carboxylic acid, tert-butyl carbonates of phenols and t-butylethers of phenols. In addition, these acid labile groups can be trityl, benzyl, benzhydryl as well as other modifications illustrated in the inhibitors above.

Radiation decomposable initiators which can be utilized in the practice of the present invention to generate acid upon exposure referred to hereinafter as the "initiator" are, for example: triarylsulfonium salts, diarylchloronium salts, diarylbromonium salts, triarylselenonium salts, thiopyrylium salts, xanthylium salts, imidazolium salts, dialkylphenacylsulfonium salts, dialkylhydroxyphenylsulfonium salts, ferrocenium salts, diazonium salts, triarylsulfoxonium salts, diaryliodoxonium salts, phenacyltriarylphosphonium salts, phenacyltrialkylammonium salts, phenacylpyridinium salts. Further examples are shown by H.-J. Timpe and H. Baumann, Adhesion 9, 9 (1984) and Crivello patents U.S. Pat. Nos. 4,058,440; 4,058,401; 4,069,055; and 4,151,175; assigned to the same assignee as the present invention and incorporated herein by reference.

The following constitute some additional examples of onium salts:

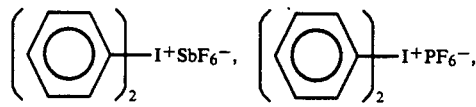

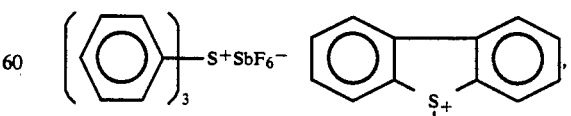

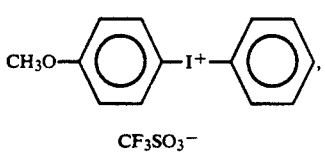

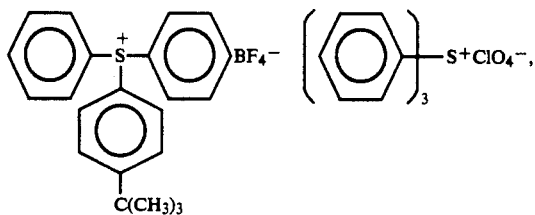

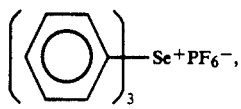

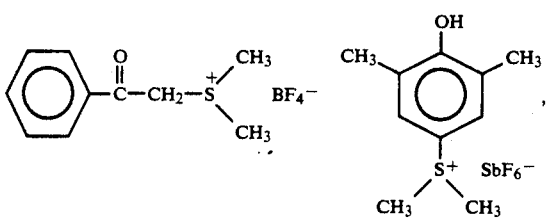

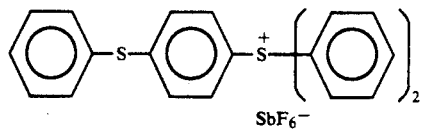

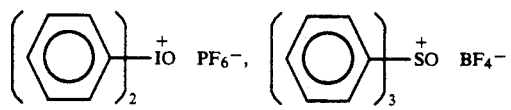

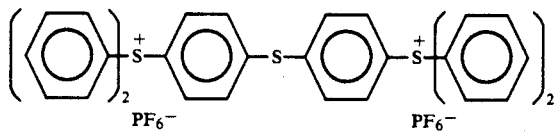

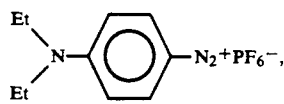

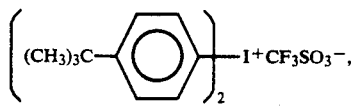

The compositions can be made by blending organic solvent, polymer, inhibitor, and the irradiation decomposable initiator.

In forming the resist composition, the order of addition of the various ingredients is not critical. It has been found that effective results can be achieved if there is utilized from about 10 to about 100 parts of inhibitor and 0.5 part to about 25 parts of initiator, per hundred parts of the polymer by weight. Preferably, there can be used from 10 to 70 parts of inhibitor, per hundred parts of polymer and 1 to 20 parts of initiator, per hundred parts of polymer by weight.

There are included in the term organic solvent which hereinafter means an organic solvent or mixture of organic solvents, which can be utilized in the practice of the present invention to make the resist composition, solvents such as 1,2-dimethoxy ethane, di(2-methoxy ethyl)ether, 1-methoxy-2-propyl acetate, chlorobenzene, 1,1,2,2-tetrachloroethane, 1-methoxy-2-ethyl acetate, dioxane, methylisobutyl ketone, cyclohexanone, n-butanol, ethylene glycol, propylene gycol, amylacetate, and butylacetate.

There is further provided by the present invention, a method for making a patterned resist on a substrate, which comprises:

(1) treating, which means spin coating, spraying, solution casting or dip coating, the substrate with the resist composition of the present invention to produce a resist-substrate composite, (2) baking the resist-substrate composite to a temperature in the range of from about 35° C. to 180° C., (3) irradiating the applied resist in a patterned manner, (4) heating the irradiated resist to a temperature in the range of from about 35° C. to 185° C., and (5) developing the irradiated resist to produce a patterned resist substrate composite.

Among the substrates which can be treated in accordance with the practice of the method of the present invention to make resist-substrate composites are copper clad laminates, silicon wafers, silicon dioxide wafers, aluminum and gallium arsenide.

Some of the developers which can be used in the practice of the method of the invention are aqueous base solutions, e.g. aqueous solutions of NaOH, KOH, and tetrabutylammonium hydroxide. Typical developers are made by the Shipley Company of Newton, Massachusetts; Hunt Company of East Providence, R.I.; and KTI Company of Wallingford, Conn.

It has been further found that the afore-described onium salts or initiators can be used in combination with various photosensitizers to enhance the absorption of a given wavelength of light or sensitize the onium salt to a region of a spectrum where it does not absorb. Typical sensitizers which can be used in combination with the afore-described initiators or mixtures thereof are, for example: benzophenone, 2-chlorothioxanthone, anthrone, 9-ethoxyanthracene, anthracene, pyrene, perylene, phenothiazine, benzil, acridine orange, benzoflavin, setoflavin-T, anthraquinone, 9,10-diphenylanthracene, 9-fluorenone, benzophenone, and coronene.

The above-described sensitizers also can be used in combination with the initiators utilized in the practice of the present invention to modify the response of the photoresist under electron beam and X-ray irradiation.

Some of the resist applications contemplated for the resist compositions of the present invention are, for example, manufacture of circuit boards, integrated circuits, multilayer resist structures, e.g. in combination with polymethylmethacrylate contrast enhancement layers, and the like. There also can be used in the resist composition of the present invention, flow control agents, surface active agents, anti-reflection dyes and wetting agents.

In order that those skilled in the art will be better able to practice the present invention, the following examples are given by way of illustration and not by way of limitation. All parts are by weight.

EXAMPLE 1

Photoresist compositions were prepared utilizing 1.5 g of various commercially available phenolic resins, 0.5 g of di-t-butylterephthalate, 0.1 g of diphenyl-4-thiophenoxyphenylsulfonium hexafluorophosphate, and 6 mL of 1-methoxy-2-propyl acetate. The various photoresist compositions were spin coated onto silicon wafers which had been previously treated with hexamethyldisilazane. The treated wafers were then baked for ½ hour at 90° C. The wafers were then exposed to imagewise irradiation using a Suss MA 56 Contact/Proximity Printer operated in the proximity mode at 313 nm, using an exposure time of 10–40 seconds with an intensity of 4.5 mW/cm$^2$. After exposure, the wafers were heated in a forced air oven for a period of 60 seconds at 110°–130° C. and then developed using a mixture of water and KTI 351 Developer. The following lists the commercially available resins utilized "Phenolic resin" along with the development mixture and type of development:

| M'F'G | Phenolic Resin | Water/Dev |
|---|---|---|
| Schenectady Chemical HRJ 2606 | cresol novolak | 1:1 |
| Maruzen Oil Resin M | poly(vinylphenol) | 5:1 |
| Molecular Rearrangements, Inc. | t-butylphenol novolak | 5:1 |

The resists were developed and 2 to 3.5 μm features were resolved.

EXAMPLE 2

Dissolution inhibitor, t-butylnaphthalene-2-carboxylate was prepared as follows:

A mixture of 51.6 g (0.3 mole) of 2-naphthoic acid, and 120 ml of thionylchloride was refluxed for one hour. Excess thionylchloride was removed. The resulting solid was dissolved in 150 mL of tetrahydrofurane and 40 grams (0.35 mole) of potassium t-butoxide was added in increments. After the addition had been completed, the reaction mixture was refluxed for four hours, cooled, and then poured into water. The resulting solid was collected by filtration, washed with water and dried in vacuo. The product was recrystallized from n-hexane to produce a crystalline solid having a melting point of 88°–90° C. Based on method of preparation, the product was t-butylnaphthalene-2-carboxylate which was obtained in a yield of 68%.

A photoresist composition was prepared in accordance with the procedure of Example 1, utilizing 1.5 g of cresol novolak resin, 0.5 g of t-butyl naphthalene-2-carboxylate, 0.1 g of diphenyl-4-thiophenoxyphenylsulfonium hexafluorophosphate, and 6 mL of 1-methoxy-2-propyl acetate. Coated silicon wafers prepared in accordance with the procedure of Example 1 provided excellent positive images with well resolved 3.5 micrometers features after imagewise exposure to UV light utilizing a 15–40 second irradiation time followed by a 30–60 second bake at 120° C. and an immersion into a 1:1 mixture of water and KTI 350.

EXAMPLE 3

Additional photoresist compositions were prepared utilizing commercially available cresol novolak resin with di-t-butylterephthalate or t-butylnaphthalene-2-carboxylate. In preparing the photoresist using di-t-butylterephthalate dissolution inhibitor, there were utilized 1.5 g of meta cresol novolak resin, 0.5 g of inhibitor, 0.1 g of 4-methoxyphenylphenyliodonium trifluoromethanesulfonate, and 0.03 g of 9-fluorenone, a photosensitizer.

The photoresist utilizing t-butylnaphthalene-2-carboxylate was combined with 1.5 g of the cresol novolak resin, 0.5 g of the inhibitor, 0.1 g 4-methoxyphenylphenyliodonium trifluoromethanesulfonate, 0.01 g of perylene photosensitizer, and 6 mL of 1-methoxy-2-propyl acetate.

The above photoresist compositions were then spin coated onto silicon wafers in accordance with the procedure of Example 1. A photoresist composition containing the di-t-butylterephthalate inhibitor and the 9-fluorenone photosensitizer was irradiated for five seconds at 313 nm, while the photoresist composition containing the t-butylnaphthalene-2-carboxylate and the perylene sensitizer was irradiated for 5 seconds at 365 nm (6.3 mW/cm$^2$) and 405–436 nm (8.1 mW/cm$^2$). The following Table combines the inhibitors, photosensitizers and wave lengths which were used:

| Inhibitor | Photosensitizer | UVλ(nm) |
|---|---|---|
| di-t-butyl-terephthalate | 9-fluorenone | 313 |
| t-butylnaphthalene-2-carboxylate | perylene | 405–436 365 |

The resists were processed in KTI 351 developer under the conditions described above, and 1 μm features were resolved.

EXAMPLE 4

Dissolution inhibitor t-butyl-2-naphthyl carbonate was prepared by the following procedure:

There were added 3.9 g (0.035 mole) of potassium-t-butoxide to a solution of 5 g (0.35 mole) of 2-naphthol in 90 mL of tetrahydrofuran under a nitrogen atmosphere. The mixture was stirred for 5 minutes and 8.3 g (0.035 mole) of di-t-butyldicarbonate was added. The mixture was stirred for 2 hours. The mixture was then poured into ice water and extracted twice with ethylacetate. The combined organic layers were washed three times with water followed by a saturated sodium chloride solution and then dried over anhydrous sodium sulfate. The mixture was then concentrated using a rotary evaporator. A crystalline solid was obtained and recrystallized from petroleum ether and then dried in vacuo. There was obtained 65% yield of t-butylnaphthyl carbonate having a melting point of 74°–75° C.

A photoresist composition was prepared following the procedure of Example 1 utilizing 1.2 g of commercially available cresol novolak resin, 0.8 g of t-butyl-2-naphthylcarbonate, 0.1 g of diphenyl-4-thiphenoxyphenylsulfoniumhexafluorophosphate and 6 mL of 1-methoxy-2-propylacetate. Wafers were spin coated and exposed for 20–40 seconds as described in Example 1 and baked at 125° C. for 30–60 seconds. There were obtained clear 2 micrometer lines and spaces after the photoresist was developed for one minute in a 1:2.5 mixture of KTI 351 and water.

EXAMPLE 5

A photoresist composition was prepared in accordance with the procedure of Example 1 utilizing 1.2 g cresol novolak resin, 0.8 g 4-t-butoxy-p-biphenyl, 0.1 g diphenyl-4-thiophenoxy-1-phenyl sulfonium hexafluorophosphate and 6 mL 1-methoxy-2-propyl acetate. Cleared 3 μm lines and spaces were obtained by exposing coated wafers to 313 nm UV for 20–40 seconds, a 30–60 second bake at 125° C. and immersion in a 1:1 solution of KTI351 and water.

EXAMPLE 6

A photoresist composition was prepared utilizing 1.5 g of commercially available cresol novolak resin, 500 mg of t-butyl-1H-indene-3-carboxylate, 100 mg of diphenyl-4-thiophenoxyphenylsulfonium hexafluorophosphate and 6 mL of 1-methoxy-2-propylacetate. The photoresist was spin coated and irradiated as described in Example 1. There was obtained clear 2.5 micron lines and spaces with irradiation at 313 nm for 15–20 seconds, a 30–60 second bake at 125° C. and a development for one minute in a 1:1 solution of KTI 351 developer and water.

EXAMPLE 7

Photoresist compositions were prepared utilizing commercially available cresol novolak, t-butyladamantane-1-carboxylate, and various initiators and 1-methoxy-2-propylacetate. One of the photoresist compositions was made by blending together 1.5 g cresol novolak, 500 mg of t-butyladamantane-1-carboxylate, 100 mg of diphenyl-4-thiophenoxyphenylsulfonium hexafluorophosphate and 6 mL of 1-methoxy-2-propylacetate. Another photoresist formulation utilized 1.5 g of the cresol novolak resin, 500 mg of the inhibitor, 110 mg of 4-methoxyphenylphenyliodonium hexafluorophosphate, and 6 mL of 1-methoxy-2-propylacetate. The various photoresist compositions were applied to silicon wafers as previously described and subjected to imagewise exposure at 313 nm for 10–15 seconds and at 254 nm for 2–3 sec at 5.22 mW/cm². The resists were postbaked 30–60 sec at 130° C. and developed with a 1:1 mixture of KTI 351 and water. There were resolved 3 μm features from the sulfonium containing photoresist and 2.5 micron features from the iodonium containing photoresist.

EXAMPLE 8

A photoresist composition consisting of 1.5 g cresol novolak resin (Schenectady Chemicals HRJ 2606), 500 mg di-t-butyladipate, 100 mg 4-methoxyphenylphenyliodonium hexafluorophosphate and 6 mL 1-methoxy-2-propyl acetate was spin coated onto silicon wafers which had been previously treated with hexamethyldisilazane and baked. A film coating of 2 micrometers was obtained. The photoresist coatings were exposed for 4–5 seconds using a Suss MA56 Contact/Proximity Printer operated in the proximity mode at 254 nm with an intensity of 5.22 mW/cm². After exposure, the wafers were postbaked for 30–60 seconds at 130° C., then developed for 60 seconds in a 1:1 mixture of KTI 351 and water. Cleared well-imaged patterns were obtained having 3.5 μm lines and spaces.

EXAMPLE 9

There was dissolved 3 g of the cresol novolak resin of Example 8 in 10 mL methyl ethyl ketone. There were added to the resulting solution, 1 g t-butyl-2-naphthalene carboxylate, 0.02 g perylene and 0.2 g 4-methoxyphenylphenyliodonium trifluoromethanesulfonate. The mixture was coated onto a copper-clad epoxy-glass circuit board and dried to remove the solvent. The dried circuit board was covered with a Mylar resin photographic negative. A GE H-3T7 medium pressure mercury arc lamp ballasted at 800 W was used to irradiate the negative for 30 seconds at a distance of 8 inches. Following imaging, the circuit board was baked for 3 minutes at 100° C. and then developed in a 1:1 mixture of KTI 351 and water. The pattern was then etched into the circuit board using an aqueous ferric chloride solution giving a clear positive image of the mask.

EXAMPLE 10

A photoresist (Formulation A) was prepared by mixing 1.5 g of Schenectady Chemicals HRJ-2606 novolak resin, 500 mg of t-butyl naphthalene carboxylate, 100 mg of 4-thiophenoxyphenyl diphenyl sulfonium hexafluorophosphate, and 7 ml of 1-methoxy-2-propyl acetate. A second photoresist (Formulation B) was prepared by combining 1.5 g of Schenectady Chemicals HRJ 2606 novolak resin, 100 mg of 4-thiophenoxyphenyl diphenyl sulfonium hexafluorophosphate, and 7 ml of 1-methoxy-2-propyl acetate. Once they were homogeneous both formulations were filtered and then spin-coated onto silicon wafers which had previously been treated with hexamethyldisilazane to promote adhesion. The coated wafers were baked in a convection oven at 100° C. for 25 minutes and then imaged using a GE H3T7 medium pressure mercury arc lamp. The coated wafers were exposed for 15 sec at a distance of approximately four inches. The wafers were then immersed in a 1:1 mixture of AZ-351 Developer and water. The times for the films to just clear to the substrate were determined. The wafers also were baked at 125° C. for 50 sec after the 15 sec exposure and prior to development. Once again, the times to clear in 1:1 AZ-351 water were measured. The following results were obtained:

| Postbake | Formulation A | Formulation B |
| --- | --- | --- |
| yes | 15 sec | 35 sec |
| no | 80 sec | 9 sec |

The above results show that Formulation B develops more slowly when a postbake is used which is consistent with the teaching of Newman U.S. Pat. No. 4,708,925. In addition, Formulation A requires a postbake to work well. These results show that the dissolution inhibitor protects the novolak during a postbake with onium salt.

EXAMPLE 11

A solution of 5 g (10 mmol) triformyl cholic acid, 1.04 mL (11 mmol) t-butyl alcohol, 2.3 g (11 mmol) dicyclohexylcarbodiimide, and 150 mg (1 mmol) 4-pyrrolidinopyridine in 25 mL dichloromethane was allowed to stand under nitrogen at room temperature for four days. At this time, the reaction mixture was diluted with ether and filtered to remove dicyclohexylurea. The filtrate was then washed with water, 5% HCl, water, and brine, and then dried over anhydrous sodium sulfate. After concentrating under reduced pressure, the crude product was purified by column chromatography over silica gel using a 3:1 mixture of cyclohexane and ethyl acetate as eluent to give 5.3 g (9.7 mmol) of t-butyl triformyl cholate as a glassy white solid. [mp=136-137C; H NMR (90 MHz, CDCl$_3$) δ 1.77 (s, 3H, Me), 1.83 (d, J=7 Hz, 3H, Me), 1.95 (s, 3H, Me), 1.1-2.4 (m, 24H), 1.5 (s, 9H, t-Bu), 3.52-4.35 (m, 3H, CH-O), 8.0 (s, 1H, CHO), 8.1 (s, 1H, CHO), 8.17 (s, 1H, CHO)].

The following components were combined and filtered to form a photoresist formulation: 1.6 g cresol novolak (Schenectady Chemicals HRJ 2606), 400 mg of t-butyl triformylcholate, 80 mg 4-methoxyphenyl phenyl iodonium hexafluorophosphate, and 8 mL of 1-methoxy-2-propyl acetate. The resulting solution was spun onto silicon wafers which had previously been treated with hexamethyldisilazane to promote adhesion. After spinning, the wafers were baked at 90° C. for 30 min and then imaged using a Suss MA-56 Proximity/-Contact Printer operated in the proximity mode at 250 nm (4.6 mW/cm$^2$). Exposures of 3-5 seconds followed by a postbake of 60 sec at 130° C. and development with a 1:1 mixture of KTI 351 Developer (KTI Corporation) and water gave cleared positive tone images of the mask.

EXAMPLE 12

2.1 g (3.8 mmol) of t-butyltriformyl cholate of Example 11 was dissolved in 25 mL of methanol and 2.5 g (18 mmol) of potassium carbonate and 4 mL of water were added. After stirring for 1.5 hours at room temperature, the reaction mixture was concentrated under reduced pressure, and the residue thus obtained was diluted with dichloromethane. Water was added and the result was transferred to a separatory funnel where the lower organic layer was drawn off and then dried over anhydrous sodium sulfate. Concentration under reduced pressure gave 1.4 g (3 mmol) of t-butyl cholate as an off-white solid which could be further purified by column chromatography over silica gel with ethyl acetate as eluent. [$^1$H NMR (90 MHz, CDCl$_3$) δ 1.68 (s, 3H, Me), 1.88 (s, 3H, Me), 1.97 (d, J=7 Hz, 3H, Me), 1.0-2.8 (m, 24H), 1.49 (s, 9H, t-Bu), 3.26-4.05 (m, 3H, CH-O)].

A photoresist (Formulation C) was prepared by mixing 800 mg of Schenectady Chemicals HRJ-2606 novolak resin, 200 mg of t-butyl cholate, 50 mg of di(4-t-butylphenyl)iodonium toluenesulfonate, and 4 ml of 1-methoxy-2-propyl acetate. A second photoresist (Formulation D) was prepared by combining 800 mg of Schenectady Chemicals HRJ-2606 novolak resin, 50 mg of di(4-t-butyl-phenyl)iodonium toluenesulfonate, and 4 ml of 1-methoxy-2-propyl acetate. Once homogeneous, both formulations were filtered and then spin-coated onto silicon wafers which had previously been treated with hexamethyldisilazane to promote adhesion. The coated wafers were baked in a convection oven at 100° C. for 25 minutes and imaged using a GE-H3T7 medium pressure mercury arc lamp. Wafers coated with both formulations were exposed for 15 sec at a distance of approximately four inches. The wafers were then immersed in a 1:4 mixture of AZ-351 Developer and water, and the time for the films to just clear to the substrate was determined. The wafers also were baked at 120° C. for 60 sec after the 15 sec exposure and prior to development. Once again, the time to just clear in 1:4 AZ-351:water was measured. The table below shows the results obtained:

| Postbake | Formulation C | Formulation D |
| --- | --- | --- |
| yes | 30 sec | 4 min, 20 sec |
| no | >15 min | 1 min, 55 sec |

The above data show that Formulation D develops more slowly when a postbake is used. It also can be seen that Formulation C requires a postbake to work. In addition, as illustrated in Example 10, these data show that the dissolution inhibitor of the present invention protects the novolak during postbake with onium salt-/novolak combinations.

Although the above results are directed to only a few of the very many variables which can be utilized in the practice of the present invention, it should be understood that the present invention is directed to the use of a much broader variety of polymers, inhibitor, and initiators, in the description preceding these examples.

What is claimed and sought to be protected by Letters Patent of the United States is as follows:

1. A positive photoresist photopatternable in the substantial absence of moisture, comprising an admixture of,
    (A) a water or aqueous based soluble phenolic resin other than a resole resin,
    (B) from at least about 10% to up to an equal proportion by weight of (A), of a water or aqueous base insoluble simple compound having a molecular weight of less than 1000 and selected from the group consisting of tertiary butyl esters, aryl tertiary butyl esters and aryl tertiary butyl carbonates, which is a dissolution inhibitor for (A), and
    (C) an aryl onium salt which generates a strong acid having a pKa of less than zero upon being irradiated, in an amount effective to deblock compound (B) when heated,
    where (B) is substituted with acid labile groups which can be deblocked by being heated in the presence of a strong acid, to thereby render (B) soluble in water or aqueous base and ineffective as a dissolution inhibitor for (A).

2. A positive photoresist photopatternable both in the presence and in the substantial absence of moisture, comprising an admixture of,
    (A) a water or aqueous based soluble phenolic resin other than a resole resin,
    (B) from at least about 10% to up to an equal proportion by weight of (A), of t-butyl cholate which is a dissolution inhibitor for (A), and
    (C) an aryl onium salt which generates a strong acid having a pKa ratio of less than zero upon being irradiated, in an amount effective to deblock compound (B) when heated,
    where (B) can be deblocked by being heated in the presence of a strong acid, to thereby render (B) soluble in water or aqueous base and ineffective as a dissolution inhibitor for (A).

3. A positive photoresist photopatternable both in the presence and in the substantial absence of moisture, comprising an admixture of,
    (A) a water or aqueous based soluble phenolic resin other than a resole resin,
    (B) from at least about 10% to up to an equal proportion by weight of (A), of t-butyl triformyl cholate which is a dissolution inhibitor for (A), and (C) an aryl onium salt which generates a strong acid having a pKa ratio of less than zero upon being irradiated, in an amount effective to deblock compound (B) when heated, where (B) can be deblocked by being heated in the presence of a strong acid, to thereby render (B) soluble in water or aqueous base and ineffective as a dissolution inhibitor for (A).

4. A positive photoresist in accordance with claim 1, wherein the dissolution inhibitor is selected from the group consisting of compounds having trityl groups, compounds having benzyl groups, compounds having benzhydryl groups, 1-trimethylsiloxy napthalene, bis(1-phenyl-1-methyl)telephthalate, alpha-phenethyl 1-naphthoate, alphaphenethyl 2-napthoate, 3-cyclohexenyl benzoate, and 3,6-bis(benzoyloxy)cyclohexene.

5. A positive photoresist in accordance with claim 1, wherein the phenolic resin is a novolak.

6. A positive photoresist in accordance with claim 1, where the arylonium salt is a diphenyliodonium salt.

7. A positive photoresist in accordance with claim 1, where the aryl onium salt is diphenyl-4-thiophenoxyphenylsulfonium hexafluoroantimonate.

8. A positive photoresist in accordance with claim 1, where the aryl onium salt is triphenylsulfonium hexafluoroantimonate.

9. A positive photoresist in accordance with claim 1, containing a photosensitizer.

10. A composite comprising a substrate and the resist composition of claim 1.

11. A composite in accordance with claim 10, where the substrate is a silicon wafer.

12. A composite in accordance with claim 10, where the substrate is a copper-clad laminate.

* * * * *

UNITED STATES PATENT AND TRADEMARK OFFICE
CERTIFICATE OF CORRECTION

PATENT NO. : 5,310,619
DATED : May 10, 1994
INVENTOR(S) : Crivello

It is certified that error appears in the above-indentified patent and that said Letters Patent is hereby corrected as shown below:

On the Title Page:
In the Title, line 3, after "ester", insert -- , a t-butyl ether --.

In the Abstract, line 5, after "labile", change "t-butyl ether or ester groups" to -- t-butyl esters, ethers or carbonates --.

Column 5, lines 10-15, in the structural formula, change the bottom substituent from "$COO_2-C(CH_3)_3$" to -- $OCO_2-C(CH_3)_3$ --; and at lines 40-45 in the right hand structural formula, change "$OSi-C(CH_3)_3$" to -- $OSi(CH_3)_3$ --.

Column 14
In claim 1, lines 33-34 "aryl tertiary butyl esters" should be -- aryl tertiary butyl ether --.

UNITED STATES PATENT AND TRADEMARK OFFICE
CERTIFICATE OF CORRECTION

PATENT NO. : 5,310,619
DATED : May 10, 1994
INVENTOR(S) : Crivello

It is certified that error appears in the above-indentified patent and that said Letters Patent is hereby corrected as shown below:

```
Column 15
In claim 4, line 6, change "bis(1-phenyl-1-
methyl)telephthalate, alpha-phenethyl 1-naphthoate,
alphaphenethyl 2-napthoate" to -- bis(2-phenyl-2-
propyl)terephthalate, beta-phenethyl 1-naphthoate,
beta-phenethyl 2-naphthoate --.
```

Signed and Sealed this

Thirteenth Day of September, 1994

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,310,619

DATED : May 10, 1994

INVENTOR(S) : Crivello

It is certified that error appears in the above-indentified patent and that said Letters Patent is hereby corrected as shown below:

On the Title Page:
item [54] and col. 1, line 4, after "ester", insert
-- , a t-butyl ether --.

In the Abstract, line 5, after "labile", change "t-butyl ether or ester groups" to -- t-butyl esters, ethers or carbonates --.

Column 5, lines 10-15, in the structural formula, change the bottom substituent from "COO$_2$-C(CH$_3$)$_3$" to -- OCO$_2$-C(CH$_3$)$_3$ --; and at lines 40-45 in the right hand structural formula, change "OSi-C(CH$_3$)$_3$" to -- OSi(CH$_3$)$_3$ --.

Column 14
   In claim 1, lines 10-11, "aryl tertiary butyl esters" should be -- aryl tertiary butyl ether --.

UNITED STATES PATENT AND TRADEMARK OFFICE
CERTIFICATE OF CORRECTION

PATENT NO. : 5,310,619

DATED : May 10, 1994

INVENTOR(S) : Crivello

Page 2 of 2

It is certified that error appears in the above-indentified patent and that said Letters Patent is hereby corrected as shown below:

Column 15

In claim 4, lines 6-8, change "bis(1-phenyl-1-methyl)telephthalate, alpha-phenethyl 1-naphthoate, alphaphenethyl 2-napthoate" to -- bis(2-phenyl-2-propyl)terephthalate, beta-phenethyl 1-naphthoate, beta-phenethyl 2-naphthoate --.

This certificate supersedes certificate of correction issued September 13, 1994.

Signed and Sealed this

Twentieth Day of December, 1994

Attest:

BRUCE LEHMAN

*Attesting Officer*   *Commissioner of Patents and Trademarks*